(12) United States Patent
Eastty et al.

(10) Patent No.: US 7,884,745 B2
(45) Date of Patent: Feb. 8, 2011

(54) ANALOGUE TO DIGITAL CONVERSION (75) Inventors: Peter Charles Eastty, Eynsham (GB); Nicholas George Tembe, Worcester (GB)

(73) Assignee: Sony United Kingdom Limited, Weybridge (GB)

( * ) Notice: Subject to any disclaimer, the term of this patent is extended or adjusted under 35 U.S.C. 154(b) by 285 days.

(21) Appl. No.: 11/911,599

(22) PCT Filed: Mar. 21, 2006
(Under 37 CFR 1.47)

(86) PCT No.: PCT/GB2006/001019
§ 371 (c)(1),
(2), (4) Date: Oct. 15, 2007

(87) PCT Pub. No.: WO2006/109013
PCT Pub. Date: Oct. 19, 2006

(65) Prior Publication Data
US 2008/0272950 A1    Nov. 6, 2008

(30) Foreign Application Priority Data

Apr. 15, 2005 (GB) ................................. 0507631.0
Apr. 15, 2005 (GB) ................................. 0507640.1

(51) Int. Cl.
H03M 1/00    (2006.01)
(52) U.S. Cl. ...................................... 341/139; 341/155
(58) Field of Classification Search ................. 341/139, 341/155, 141, 120, 126, 118
See application file for complete search history.

(56) References Cited

U.S. PATENT DOCUMENTS 5,103,306 A * 4/1992 Weiman et al. .......... 348/400.1
5,305,349 A * 4/1994 Dent .......................... 370/209

(Continued)

FOREIGN PATENT DOCUMENTS

DE    44 27 388    2/1996

(Continued)

OTHER PUBLICATIONS

Tani, et al., "20 bit A-to-D and D-to-A Converting Systems for Digital Audio", International Conference on Consumer Electronics Digest of Technical Papers (ICCE), vol. Con. 8, pp. 210-211, XP000076032, 1989.

*Primary Examiner*—Rexford Barnie
*Assistant Examiner*—Joseph Lauture
(74) *Attorney, Agent, or Firm*—Oblon, Spivak, McClelland, Maier & Neustadt, L.L.P.

(57) ABSTRACT

An analog-to-digital conversion arrangement converting an input analog signal into an output digital representation. Two or more analog-to-digital conversion paths each applying a conversion mapping between input analog signal magnitudes and respective digital values generate an intermediate representation of the input analog signal, the conversion paths being operable to apply different respective conversion mappings. An output circuit combines the intermediate representations from at least two conversion paths to generate the output digital representation, the intermediate representations being combined according to a weighting dependent on the magnitude of the input analog signal. At least one of the conversion paths has an enhanced sensitivity mode appropriate to a range of magnitudes of the input signal that are below a threshold magnitude. Control logic inhibits operation in the enhanced sensitivity mode if the magnitude of the input analog signal exceeds the threshold magnitude.

35 Claims, 11 Drawing Sheets

U.S. PATENT DOCUMENTS

| | | | |
|---|---|---|---|
| 5,627,879 A * | 5/1997 | Russell et al. | 370/328 |
| 5,714,956 A | 2/1998 | Jahne et al. | |
| 6,377,196 B1 * | 4/2002 | Kolsrud et al. | 341/118 |
| 6,707,402 B1 | 3/2004 | Kern | |
| 6,873,281 B1 * | 3/2005 | Esterberg et al. | 341/163 |
| 2002/0023191 A1 * | 2/2002 | Fudeyasu | 711/104 |
| 2003/0112163 A1 * | 6/2003 | Ercan et al. | 341/131 |
| 2004/0179118 A1 | 9/2004 | Itani | |
| 2005/0093623 A1 * | 5/2005 | Ranganathan | 330/69 |

FOREIGN PATENT DOCUMENTS

| | | |
|---|---|---|
| EP | 1 111 795 | 1/2004 |
| WO | 03 009478 | 1/2003 |

\* cited by examiner

ANALOGUE TO DIGITAL CONVERSION

This invention relates to analogue-to-digital conversion.

Analogue-to-digital conversion is well-known and is used to convert an input analogue signal into an output digital signal representing the input analogue signal. Current analogue-to-digital converters are only capable of handling an input analogue signal with a dynamic range of up to approximately 120 dB. Whilst this may be sufficient for a line level signal, an analogue input received from a microphone may have a much larger dynamic range. This may be due to the characteristics of the microphone (such as its sensitivity) and/or the audio events that the microphone is responding to (such as very loud noises). To compensate for this, current audio systems provide a gain control for the microphone input so that the dynamic range of the input analogue signal can be matched to the capability of the analogue-to-digital converter. This gain control may be provided, for example, at the microphone itself or at the apparatus that uses the analogue-to-digital converter. Therefore, when an analogue-to-digital converter is being used interchangeably with a variety of types of input analogue signal (such as microphone or line), the user must remember to control the input gain accordingly.

One method of increasing the dynamic range that an analogue-to-digital converter can handle is to generate one or more amplified versions of the input analogue signal. Each of these amplified versions is then converted to a corresponding intermediate digital signal, which is then attenuated by an amount corresponding to the respective initial amplification. Another intermediate digital signal may also be generated simply by using an analogue-to-digital converter on the input analogue signal. The output digital signal is then formed by switching between the intermediate digital signals, the switching being controlled in dependence upon the magnitude of the input signal.

This invention provides an analogue-to-digital conversion arrangement for converting an input analogue signal into an output digital representation, the arrangement comprising:

two or more analogue-to-digital conversion paths each applying a conversion mapping between input analogue signal magnitudes and respective digital values to generate an intermediate representation of the input analogue signal, the conversion paths being operable to apply different respective conversion mappings; and an output circuit operable to combine the intermediate representations from at least two conversion paths to generate the output digital representation, the intermediate representations being combined according to a weighting dependent on the magnitude of the input analogue signal.

This invention also provides an analogue-to-digital conversion arrangement for converting an input analogue signal into an output digital representation, the arrangement comprising:

two or more analogue-to-digital conversion paths each operable to generate a respective intermediate representation of the input analogue signal, in which at least one of the conversion paths has an enhanced sensitivity mode appropriate to a range of magnitudes of the input signal which are below a threshold magnitude;

control logic for inhibiting operation in the enhanced sensitivity mode if the magnitude of the input analogue signal exceeds the threshold magnitude; and an output circuit arranged to derive the output digital representation from one or more of the intermediate representations.

By combining the intermediate representations from at least two of the conversion paths, embodiments of the invention generate an output digital signal with an improved signal-to-noise ratio. The improvement is dependent upon the weightings being used. For example, it is possible to select weightings such that combining the intermediate representations provides approximately 6 dB of extra signal whilst only introducing 3 dB of extra noise.

Embodiments of the invention recognise that if (for example) an amplifier or other component in one of the conversion paths overloads, it can have a damaging effect on the input signal handled by other conversion paths. To help alleviate this problem, it is preferred that at least one of the conversion paths has an enhanced sensitivity mode appropriate to a range of magnitudes of the input signal which are below a threshold magnitude; and that the arrangement comprises control logic for inhibiting operation in the enhanced sensitivity mode if the magnitude of the input analogue signal exceeds the threshold magnitude.

By inhibiting a conversion path from operating on an input analogue signal which has a magnitude that exceeds a threshold magnitude, the distortion that would otherwise have been introduced into the output of that conversion path is avoided whilst at the same time, the distortion that would otherwise have been introduced into the inputs of the other conversion paths is also prevented. This results in an output digital signal of improved signal-to-noise ratio.

In embodiments of the invention, before the intermediate representations are combined, the arrangement is operable to modify one or more intermediate representations to compensate for differences in the conversion mappings. To compensate for component tolerances, long-term drift or the like, it is preferred that the arrangement comprises means for comparing two or more intermediate representations; and means for adjusting the magnitude of at least one of the intermediate representations in accordance with the comparison.

To make an appropriate use of the additionally available signals while aiming to reduce overall noise, it is preferred that the weighting applied by the output circuit is dependent on the conversion mappings of the conversion paths.

The combination of multiple intermediate signals generated using different conversion mappings may well result in the generation of a digital signal having more resolution (i.e. more bits per sample) than is required. It is therefore preferred that the arrangement comprises means for reducing the resolution of the output digital representation.

At least one of the conversion paths may comprise an adjuster operable to adjust the magnitude of the input analogue signal to generate a magnitude-adjusted analogue signal; and a converter operable to form the respective intermediate representation as a digital version of the magnitude-adjusted input analogue signal. To allow a convenient way of mapping at two or more possible conversion mappings, it is preferred that the adjuster is selectively operable to adjust the magnitude of the input analogue signal in accordance with two or more possible degrees of adjustment.

Conveniently, the adjuster may comprise an input buffer and an amplifier. It is preferred that the gain of the amplifier is determined, at least in part, by an input resistance; and the input resistance comprises two series-connected resistors.

In order to provide a way of altering the operation of the adjuster, it is preferred that a switch operable to ground the junction of the two series-connected resistors in order to alter the gain of the amplifier is provided. To give a different gain value when the switch is operated, if is preferred that the switch is operable to ground the junction via another resistor.

In another embodiment, the arrangement comprises a pair of the adjusters arranged to handle a balanced signal; and a switch operable to connect together the junctions of the respective series-connected resistors in the two adjusters, in order to alter the gain of the adjusters. Again, it is preferred that the switch is operable to connect the junctions together via at least one further resistor. To provide an improved operation of the switch, it is preferred that the switch is operable to connect the junctions together via a substantially symmetric resistor arrangement, the switch being disposed at or near a ground potential with respect to the symmetric resistor arrangement.

To reduce any possible switching artifacts, it is preferred that in an arrangement in which at least one of the conversion paths is switchable between two or more conversion mappings, the output circuit is operable not to include the intermediate representation from a conversion path, for a predetermined period after the path has switched conversion mapping, in the generation of the output digital representation.

To avoid the conversion mappings switching too often, while still retaining the ability to track rapidly-rising signals while avoiding overload, it is preferred that the arrangement comprises control logic operable to control switching of a conversion mapping in response to the magnitude of the input analogue signal rising above a threshold magnitude or falling below the same or another threshold magnitude; and to inhibit switching of the conversion mapping for at least a predetermined time period after the magnitude of the input analogue signal has fallen below the threshold magnitude. The control logic may comprise an analogue-to-digital converter, having an operating speed faster than a conversion path.

Further respective aspects and features of the present invention are defined in the appended claims.

Embodiments of the invention will now be described, by way of example only, with reference to the accompanying drawings in which.

Figure 1:
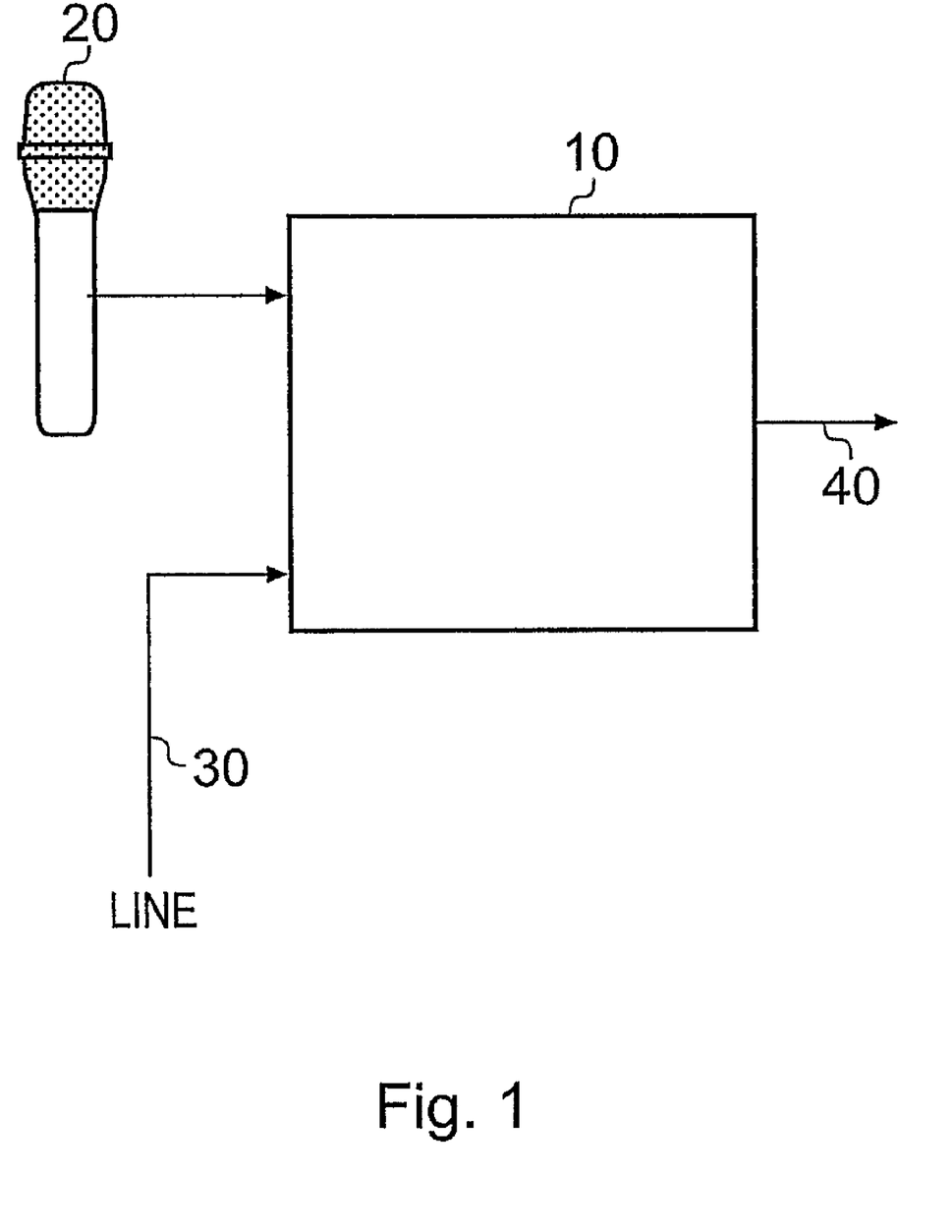
FIG. 1 provides a schematic overview of an analogue-to-digital conversion (ADC) arrangement.

FIG. 1 provides a schematic overview of an analogue-to-digital conversion (ADC) arrangement 10. The ADC arrangement is intended for handling audio signals, although of course the techniques described here may be used for signals other than audio.

Two example inputs to the ADC arrangement 10 are shown, these being a signal from a microphone 20 and a so-called line level signal 30 (e.g. an audio line level signal). Either one of these is processed by the ADC arrangement 10 to generate an output digital signal 40.

To operate at a high quality, an audio ADC needs a moderately fast sampling rate (e.g. 44.1 kHz, 48 kHz, 96 kHz etc.) but a very high signal to noise ratio or dynamic range. In previous systems, input level controls are used to attempt to match the general level of the input signal to the available dynamic range of an ADC. In the present system, such input level controls are not used. This means that in order to cater for the range of signal levels which may be provided by a microphone or a line input, the ADC arrangement 10 needs a dynamic range of about 150 dB. However, the best individual ADCs available for audio use at the priority date cannot even achieve 120 dB of dynamic range. So, a hybrid approach is used.

Figure 2:
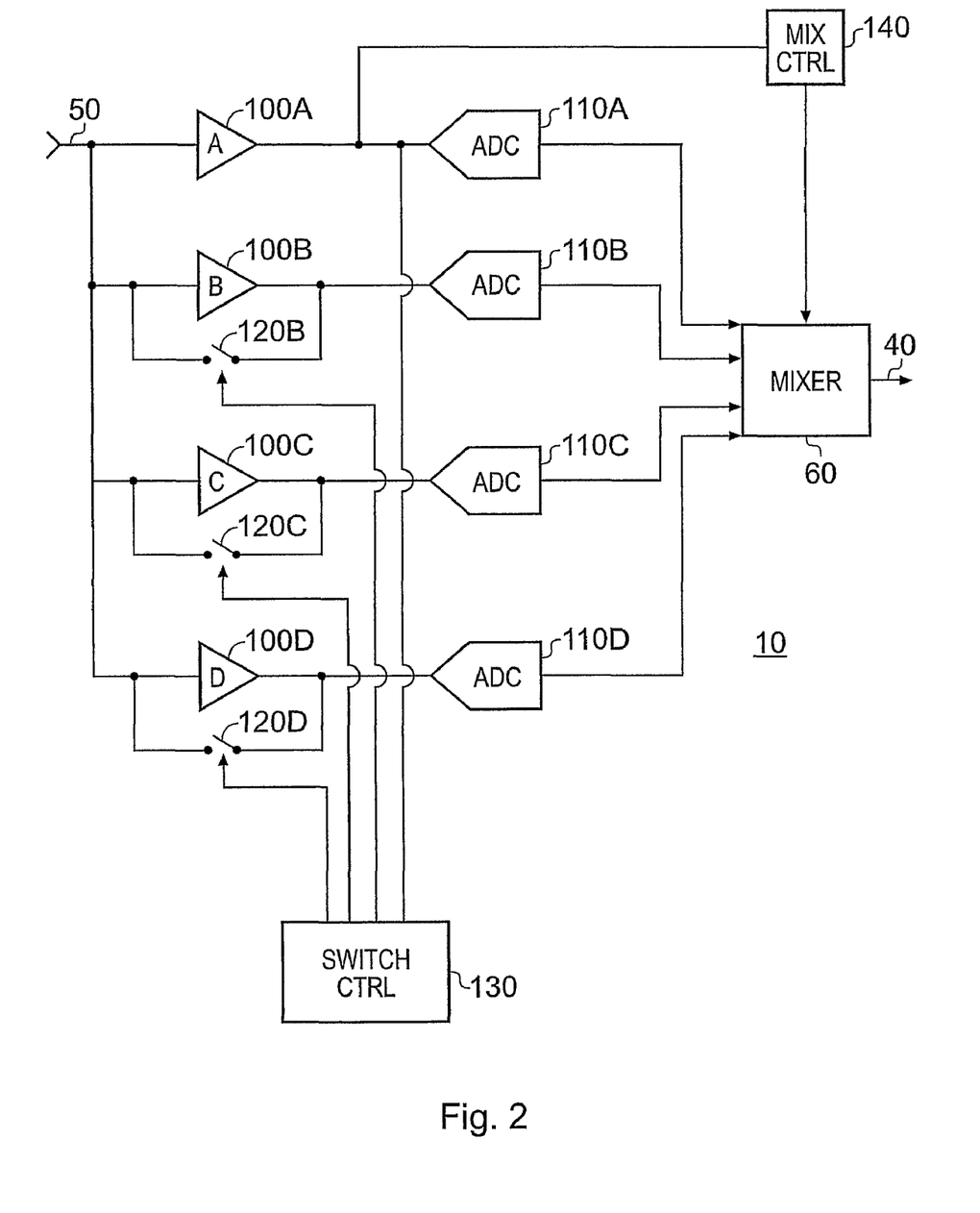
FIG. 2 schematically illustrates an ADC arrangement.

FIG. 2 schematically illustrates an ADC arrangement 10 according to an embodiment of the invention. An input signal 50 is processed by an array of (in this example case) four conversion paths in parallel. The digital outputs produced by each conversion path (to be referred to as intermediate representations) are supplied to a mixer 60 which combines the intermediate representations to generate the output digital signal 40.

The conversion paths are labelled as paths A, B, C and D. Each comprises a gain controller 100 and an ADC device 110, which together provide a conversion mapping between an input analogue signal and a corresponding output digital value. Note that a change in the gain (degree of adjustment) of the gain controller 100 is considered to be a change in the conversion mapping.

The ADC devices 110 are nominally identical. The gain controllers 100 provide different degrees of gain or attenuation so that each of the ADCs 110 receives a version of the input analogue signal which has been subjected to a different degree of level variation. Note that in the mixer, a degree of level variation could be provided in the digital domain to compensate for the input amplification of the analogue signal. In fact, in the present embodiment, such a compensating level adjustment in the digital domain is instead provided between the ADC 110 and the mixer 60, but this is not shown in FIG. 2 for clarity of the diagram. It will instead be described below with reference to FIG. 7.

Three of the gain controllers 100 B . . . 100 D are provided with a switchable gain, shown schematically as a switch 120 B . . . 120 D. The switches are controlled by a switch controller 130 which will be described in more detail below. In basic terms, the switch controller receives the input to the ADC 110 A (in fact this is equivalent to the input signal without attenuation, as described below) and from it derives control signals to control the switches 120 B . . . 120 D.

It will of course be appreciated that all of the gain controllers could have switchable gains. However, the arrangement shown in FIG. 2 has the advantage of less complexity over such an arrangement.

The mixer 60 is controlled by a mix controller 140 which, although this is not shown in FIG. 2 for clarity, operates in co-operation with the switch controller 130.

The overall operation of FIG. 2 is as follows.

When the switch 120 is not activated, each of the gain controllers 100 A . . . 100 B has a different respective gain. For example, the gains might be:

100 A: 0 dB
100 B: 12 dB
100 C: 24 dB
100 D: 36 dB

Within the range of signal levels which can be expected from a microphone or a line input, one of the conversion paths (gain controller 100 and ADC 110) will be best suited to handle the input signal and to convert it to a digital signal with less noise and/or distortion than the other three conversion paths would individually achieve. The mixer 60 is controlled so that this most-appropriate conversion path provides a major component of the output digital signal. However, one or more of the other conversion paths also contributes to the output digital signal. By handling this combination appropriately, a lower noise can be achieved than would be the case if only one conversion path were used. Techniques for this will be described below.

Turning to the purpose of the switches 120, it is recognised that if any one of the gain controllers or ADCs is overloaded, it can cause a signal distortion which may affect the input to the other conversion paths. So, even if the intermediate digital signal produced by an overloaded conversion path is not used by the mixer to contribute to the output digital signal 40, the overloaded conversion path can still have a damaging effect on the overall performance of the ADC arrangement.

To alleviate this problem, the gain of the gain controllers 100 B . . . 100 D is switchable between the value set out above and a value of 0 dB (the same as the gain controller 100 A). When the level of the input signal is such that the conversion path would be overloaded, the gain of that conversion path is set to 0 dB (i.e. the enhanced sensitivity operation offered by the increased gain is inhibited) so as to avoid the problem. Of course, it will be appreciated that the overloaded ADC could simply be switched out of operation in order to inhibit its operation in the enhanced sensitivity mode. However, keeping it in the system, but at a reduced gain, can provide the lower noise advantages described above.

This change of gain value can be achieved very quickly. Audio ADC devices 110 A. D tend to have a relatively long delay (e.g. 1 mS). The switch controller 130 is arranged to operate much more quickly than this, for example by using a fast ADC device normally intended for high speed data acquisition. Such an ADC device would tend to operate to a resolution of, for example, 10 bits and with a much worse signal to noise ratio than the audio ADC, but it can achieve an output data value in the order of 1 μS. So, the potential overload can be detected long before the ADCs 110 output a data value based on the overloaded signal. Also, the amplifier gains can be adjusted where necessary in a very short time indeed to avoid the overload situation affecting other conversion paths. A further step is taken to avoid any problems with this switching arrangement, which is that the output from a conversion path is not used by the mixer 60 to contribute to the output digital signal for a predetermined time (e.g. 0.1 mS) starting with the switching of the gain of that conversion path.

The amplifier 100 A provides a gain of 0 dB so it would in principle be possible to dispense with that amplifier and provide a direct connection between the input signal and the ADC 100 A. However, it is preferred that a 0 dB gain amplifier is provided to give buffering and impedance matching properties which correspond to those of the other three channels.

An example of a suitable ADC device to act as an audio ADC 110 is a PCM4204 by Texas Instruments™. An example of a suitable ADC device for use in the switch controller 130 is an ADS7861, again by Texas Instruments.

Figure 3:
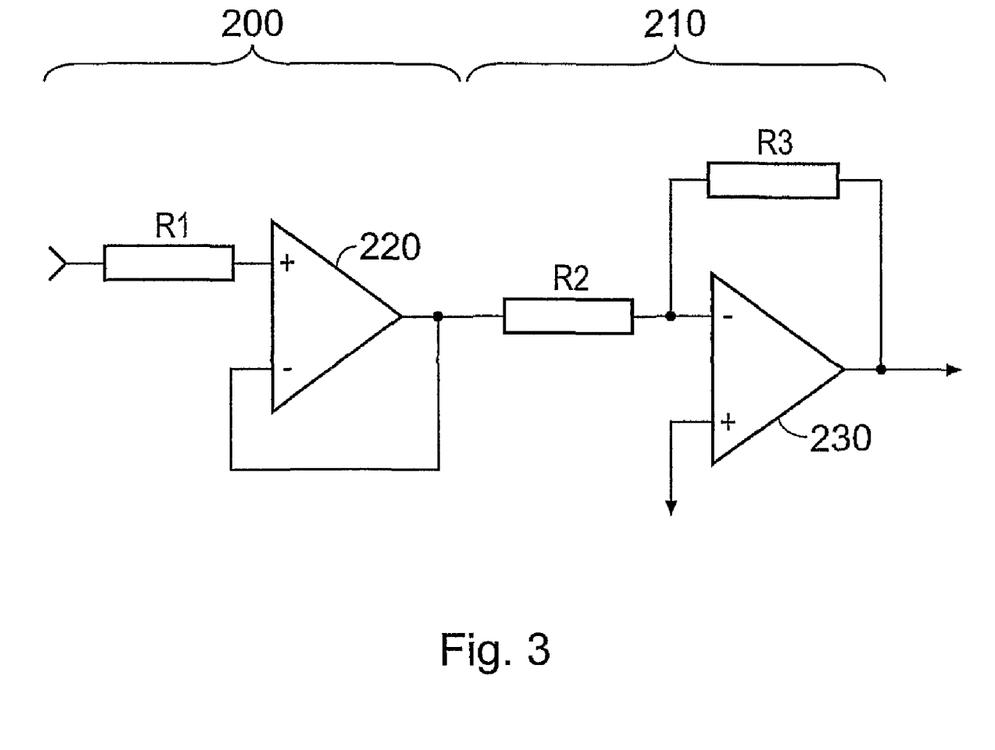
FIG. 3 schematically illustrates an amplifier.

FIG. 3 schematically illustrates an amplifier which may be used as the basis of a gain control element 100. The amplifier comprises a unity-gain buffer 200 formed of a resistor R1 and an operational amplifier 220, followed by an inverting amplifier stage 210 formed of resistors R2, R3 and an operational amplifier 230. The buffer stage acts as a current amplifier with unity voltage gain. The inverting amplifier stage 210 has a gain defined by the ratio of R3 and R2. In order to avoid introducing excessive noise using the amplifier 210, it is desirable to keep the values of the resistors R3 and R2 low where this is still consistent with the current driving capabilities of the operational amplifier 210. But at the highest gain value (the amplifier 100 D), this constraint is difficult to meet. In other words, the requirements for R3/R2 to be high and R3 itself to be relatively low (to avoid introducing noise) mean that the operational amplifier 220 cannot handle a sufficiently low value of the resistor R2 at its output.

The skilled man will appreciate that—apart from the constraints specifically described in the present application—the choice of resistors to achieve a desired gain level is a matter of routine.

Figure 4:
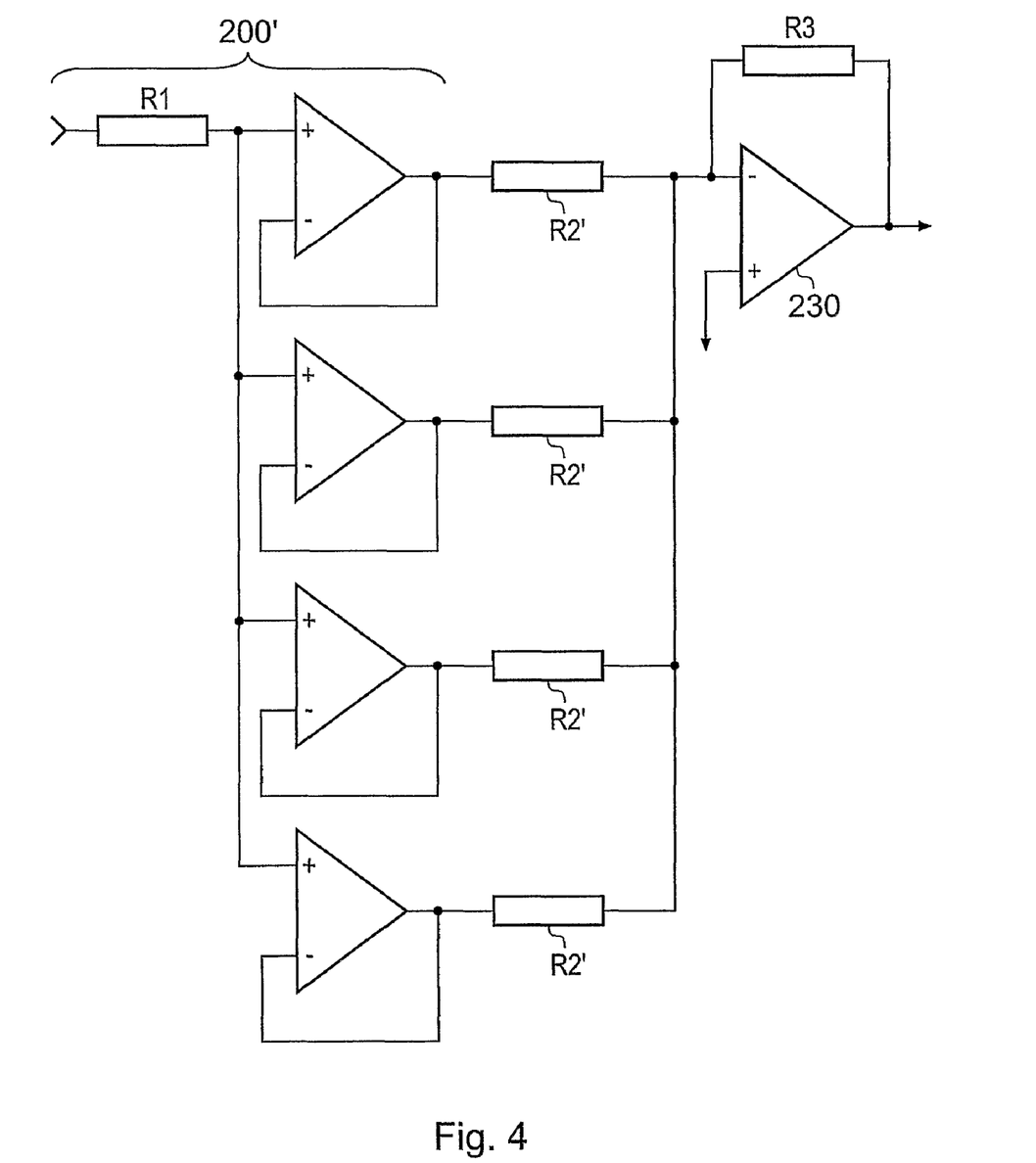
FIG. 4 schematically illustrates an amplifier with multiple parallel buffer stages.

Referring to FIG. 4, to avoid this problem, for the amplifier 100 D a parallel arrangement of operational amplifiers 220 and corresponding resistors R2' is provided, where the four (in this case) instances of R2' act in parallel to provide the low value of R2 required for the ratio R3/R2 to give the required gain.

So far, the amplifiers that have been described above have had a fixed gain determined by the ratio of the resistors R3 and R2. Techniques will now be described for making that gain variable, for use as the amplifiers 100 B . . . 100 D. In particular, FIG. 5 schematically illustrates a switched-gain amplifier for use with unbalanced audio signals, and FIG. 6 schematically illustrates a switched-gain balanced amplifier.

Figure 5:
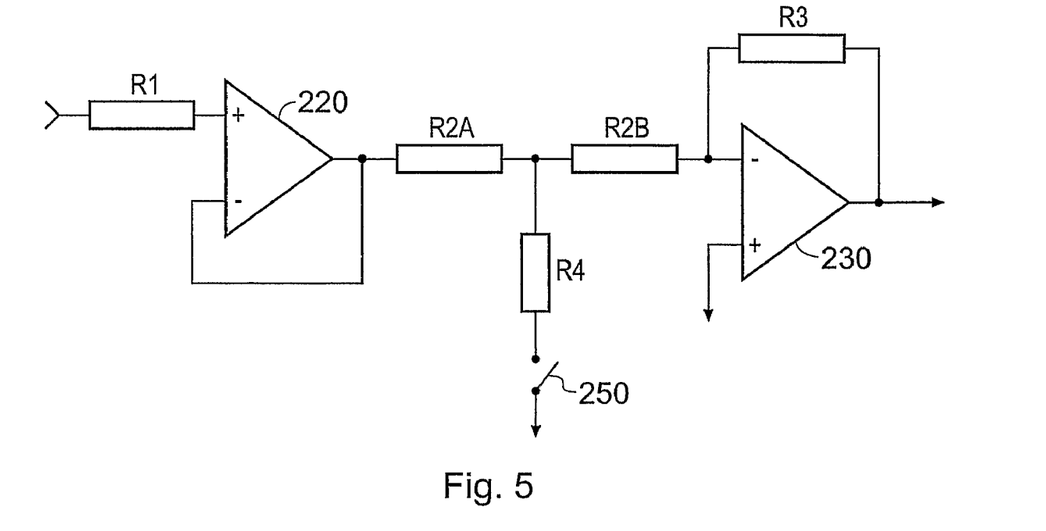
FIG. 5 schematically illustrates a switched-gain amplifier.

Referring first to FIG. 5, the arrangement is fundamentally as shown in FIG. 3, except that the resistor R2 is formed of a pair of nominally identical resistors R2A and R2B arranged is series to provide the required value of R2 (i.e. to give the desired gain value). In normal operation, the circuit of FIG. 5 acts exactly as the circuit of FIG. 3.

A solid state switch 250 (e.g. a transistor switch) is provided. When the switch is closed, it shorts the junction of the two resistors R2A, R2B to ground via a further resistor R4. By selecting R4 appropriately, the gain of the circuit of FIG. 5 when the switch 250 is closed can be made equal to unity (0 dB). For example, for an amplifier that switches between 12 dB and unity gain, R2A=R2B=600 ohms; and R4=130 ohms.

Figure 6:
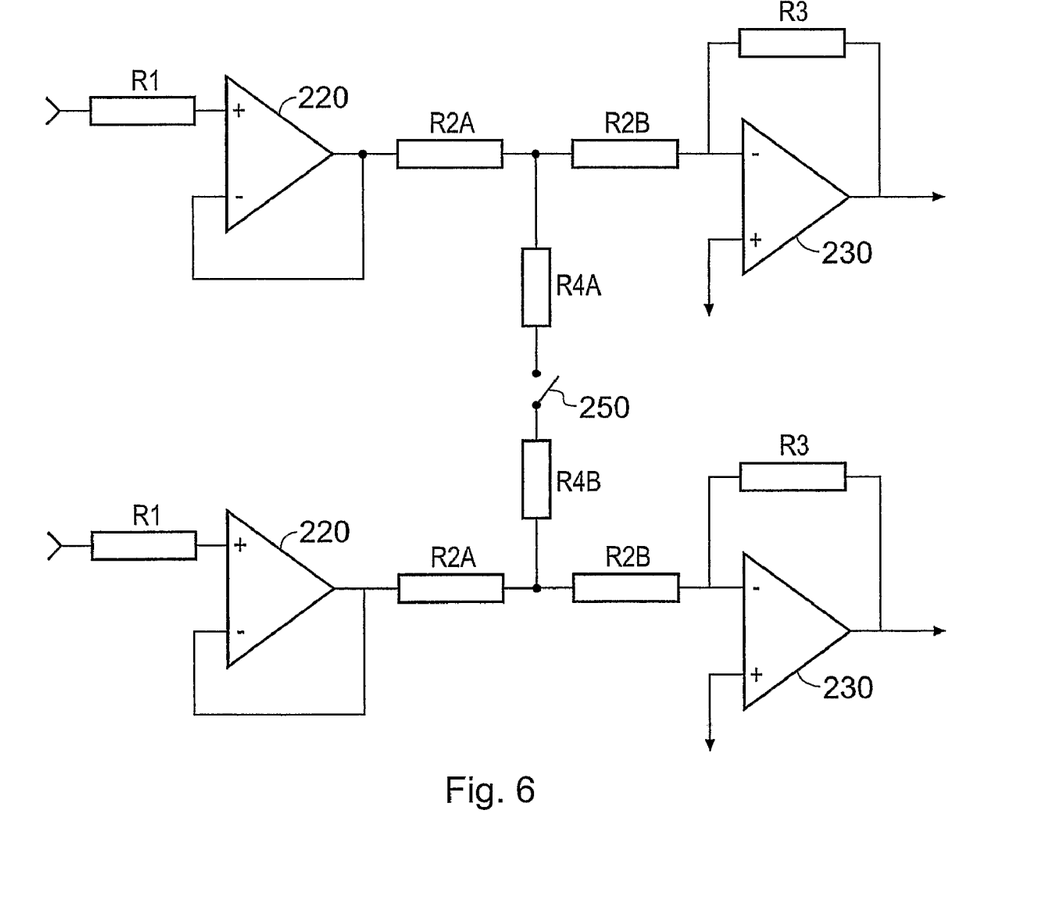
FIG. 6 schematically illustrates a switched-gain balanced amplifier.

The balanced arrangement of FIG. 6 is very similar. Two amplifier chains are provided in parallel. When the switch 250 is open, the amplifier chains operate entirely independently. The signal is balanced so the inputs to the two amplifier chains are in anti-phase.

When the switch 250 is closed, the junctions of the resistors R2A, R2B in each amplifier chain are connected together via resistors R4A, R4B. Again, this gives a unity gain to the whole arrangement.

In both FIG. 5 and FIG. 6, the switch 250 is arranged to be as close to ground potential as possible. In FIG. 5 this is achieved by positioning the switch 250 between the resistor R4 and ground, and in FIG. 6 it is achieved by positioning the switch 250 symmetrically between the two amplifier chains (assuming R4A and R4B are nominally identical). This is a simple measure to provide more reliable operation of the switch and to reduce the effects of the switch having a signal level-dependent resistance when closed. Note also that the switch is open during the higher gain operation of the amplifier circuits so any level-dependent resistance of the switch in its closed state is less significant to the normal operation of the ADC arrangement.

Note that although the input buffers are shown as having unity voltage gain, this need not necessarily be the case. The input buffers could have a non-unity voltage gain if desired.

Figure 7:
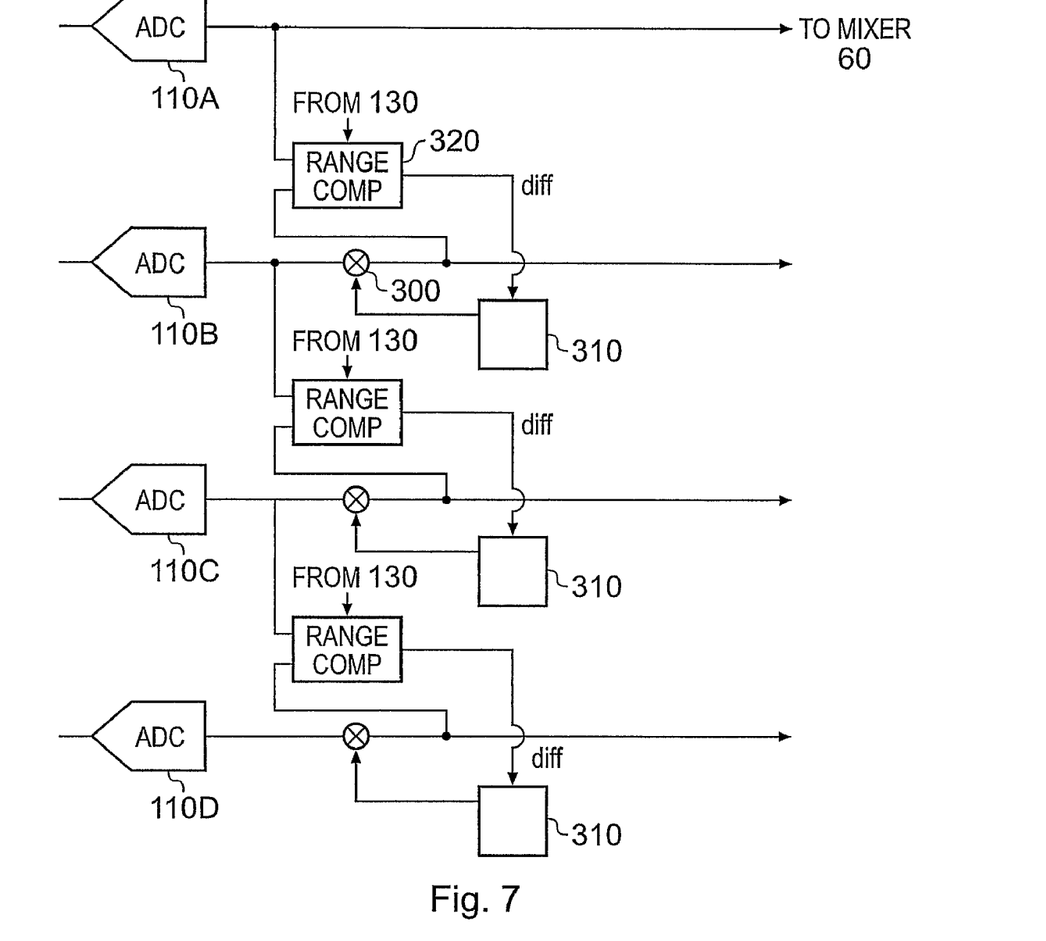
FIG. 7 schematically illustrates a calibration system.

FIG. 7 schematically illustrates a calibration system.

The calibration system serves two purposes. One is to compensate for the different degrees of amplification provided by the amplifiers 100 so that the intermediate digital signals produced by the ADCs 110 can be added together validly by the mixer 60. The other is to deal with minor fixed or time-dependent variations between the actual performance of the amplifiers 100 and their specified performance. Even if high quality analogue components are used in the present embodiments, there is always a small tolerance associated with component values, and also a change in component properties can occur with time (as the devices age) or with temperature.

Referring to FIG. 7, the output of the ADC 110B is multiplied in a multiplier 300 by a factor generated by a servo 310. This factor has the effect of scaling the output of the ADC 110B (an intermediate representation) to be comparable with the output of the ADC 110A (which did not undergo the 12 dB of amplification provided by the amplifier 110B), to compensate for differences in the conversion mappings. This then means that the signals can be validly added together in various combinations by the mixer 60.

The servo 310 in turn generates the multiplication factor by filtering a value derived by comparing the output of the ADC 110A and the output of the multiplier 300. In theory, these should be identical, and if they are not, the servo 310 adjusts the multiplication factor so as to render the two signals identical.

The operation of the servo is controlled by a range comparator 320. The range comparator 320 has two main functions. One is to generate a difference value (diff) representing the numerical difference between the scaled output of one ADC and the unscaled output of the other ADC. The other is to avoid errors due to clipping.

Because of the large gain difference at the input of the ADC 110 B compared to the input of the ADC 110 A, it is possible that the ADC 110 B will clip the input signal at a much lower signal level than the ADC 110 A. During times when the input signal is clipped, it would be invalid to compare the multiplied output of the ADC 110B with the output of the ADC 110 A to correct the multiplication factor. So, the range comparator 320 ensures that corrections to the multiplication factor are made based only on portions of the signal near to zero, i.e. below the clipping level of the more sensitive of the two conversion paths. The range comparator achieves this by replacing a calculated difference value with the value zero if the signals to be compared are outside of the required valid range.

The range comparator 320 also controls the operation of the servo 310 in accordance with the state of the switch control signal relating to the amplifier 100 B. The gain of the amplifier 100 B can have one of two values: 12 dB or 0 dB in this example. Clearly, the multiplication factor used in the two instances should be different and the corrections applied to the two multiplication factors will be different. So, the switch control signal from the switch controller 130 is a significant input to the correction process.

A corresponding process happens as between the outputs of the ADCs 110 B and 110 C and as between the outputs of the ADCs 110 C and 110 D. In each case, a multiplication factor is derived for the situation in which the amplifier 100 in a channel is operating at its normal gain, and the situation in which it has been switched to operate at 0 dB gain.

Figure 8:
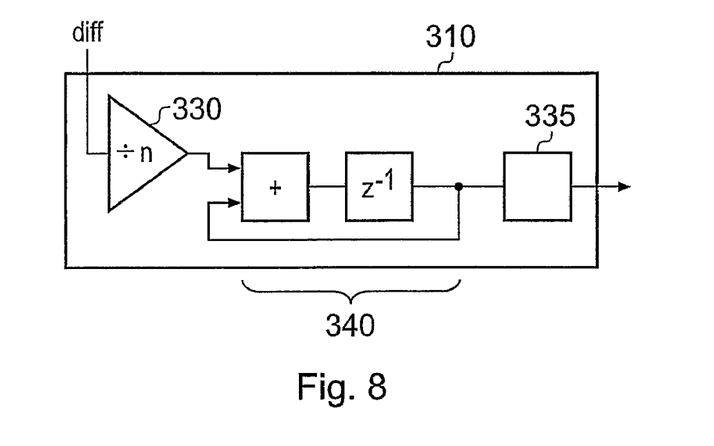
FIG. 8 schematically illustrates a servo loop.

FIG. 8 schematically illustrates the servo 310. This is shown in a simplified form, and it should also be remembered that servo technology is well established and many different types of servo control could be used.

In FIG. 8, the signal diff, i.e. the result of the comparison carried out by the range comparator 320, is supplied to a divider 330. This establishes a time constant for the servo, by dividing the difference diff by a number n. For example, in a system operating at a sample rate of 44.1 kHz, there will be 44100 values of diff generated per second. To establish a time constant of, say, 1 minute, n should be 44100*60. The output of the divider is then filtered by a low pass filter 340. The filtered difference value is passed to logic 335 to generate the multiplication factor as an output.

Because sudden changes are undesirable, and because ageing and temperature effects (or the like) occur slowly, the filter 340 can have a time constant of minutes or even hours.

Figure 9:
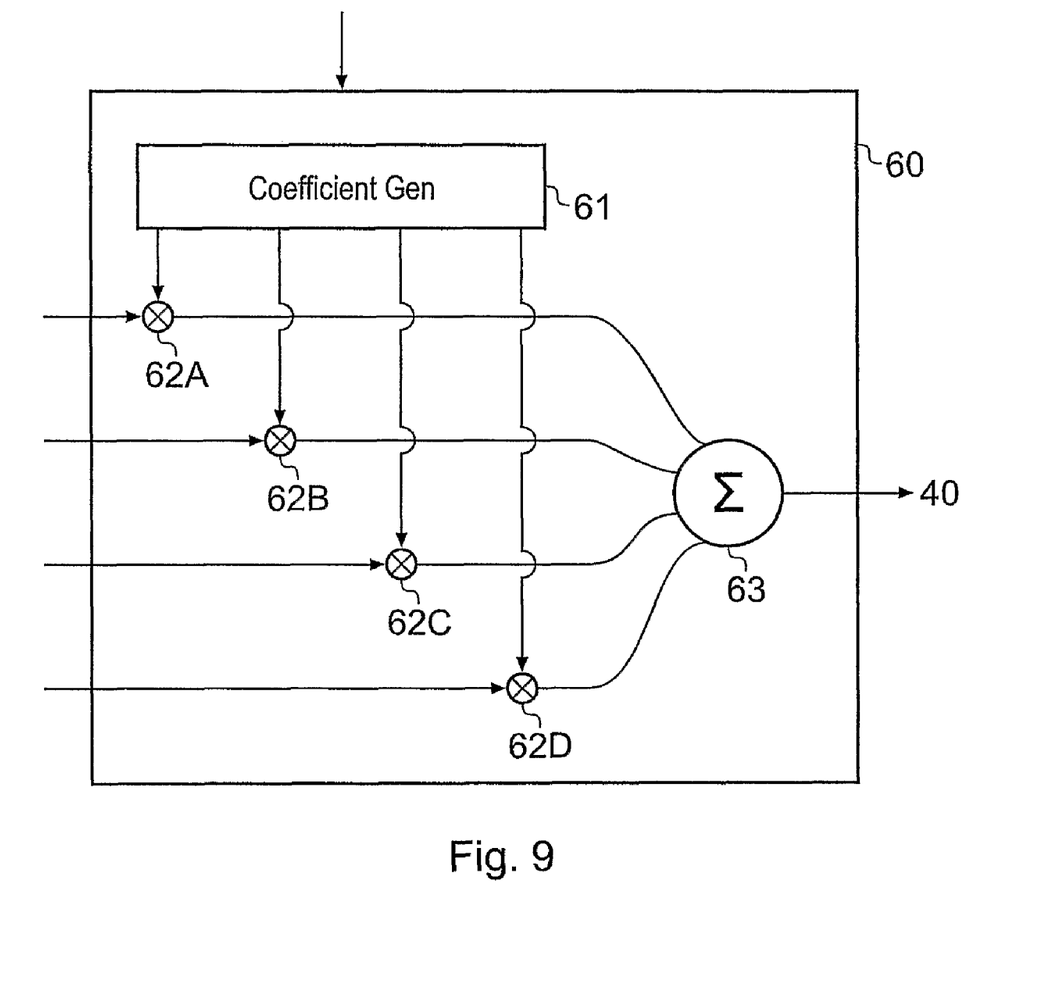
FIG. 9 schematically illustrates a mixer.

FIG. 9 schematically illustrates the operation of the mixer 60. This receives four inputs, being the intermediate digital signal generated by the ADC 110 A and the three multiplied digital signals from the multipliers 300 relating to the ADC 110 B, C and D. Each of these intermediate digital signals is multiplied by a respective coefficient. The coefficients are generated by a coefficient generator 61 and the multipliers are illustrated at 62 A . . . 62 D. The outputs of the multipliers 62 A . . . D are summed by a summer 63 to generate the output digital signal 40.

The coefficient generator 61 can use sets of fixed mixing coefficients dependent on the nominal relative gains of the amplifiers 100, or could use coefficients derived from the calibration system of FIG. 7. In either event, it is preferable from a noise point of view to combine various signals in proportion to the square of the relative gains of the amplifiers in those conversion paths. This will become clear from the following tables.

The following table provides examples of the gain provided by switched amplifiers given various levels of the input audio signal.

| | Level of input audio signal (dB) | | | |
|---|---|---|---|---|
| Amplifier | >−12 | −24 to −12 | −36 to −24 | <−36 |
| 100 A | 0 | 0 | 0 | 0 |
| 100 B | 0 | +12 | +12 | +12 |
| 100 C | 0 | 0 | +24 | +24 |
| 100 D | 0 | 0 | 0 | +36 |

The following table gives the ratio of linearised gains (degrees of adjustment) provided by the switched amplifiers given various levels of the input audio signal, the ratios being with reference to the highest gain amplifier in each column.

| | Level of input audio signal (dB) | | | |
|---|---|---|---|---|
| Amplifier | >−12 | −24 to −12 | −36 to −24 | <−36 |
| 100 A | 1.0 | 0.25 | 0.0625 | $3.90625 \times 10^{-3}$ |
| 100 B | 1.0 | 1.0 | 0.25 | 0.0625 |
| 100 C | 1.0 | 0.25 | 1.0 | 0.25 |
| 100 D | 1.0 | 0.25 | 0.0625 | 1.0 |

The following table lists the combination weightings to be used by the combiner (squared values of linearised gains). It can be seen that these weightings depend on the magnitude (level) of the input audio signal. The values marked as "ignore" can indeed be ignored or can be included with the very small coefficient appropriate to that conversion path.

| | Level of input audio signal (dB) | | | |
|---|---|---|---|---|
| Amplifier | >−12 | −24 to −12 | −36 to −24 | <−36 |
| 100 A | 1 | 1/16 | ~0 (ignore) | ~0 (ignore) |
| 100 B | 1 | 1 | 1/16 | ~0 (ignore) |
| 100 C | 1 | 1/16 | 1 | 1/16 |
| 100 D | 1 | 1/16 | ~0 (ignore) | 1 |

Note that these weightings are in fact normalised for use, to give a total weighting of 1. So, each weighting in the first column would be divided by 4, being the sum of the weightings. In the third column, each weighting would be divided by 17/16, and so on.

These are the steady-state combination weightings. In a transition from one of these states to another (i.e. when the signal level moves from one column to another in the above tables) it is desirable to use a smoothed rather than an abrupt transition for both the gain changes and the weighting coefficient changes. A raised cosine shaped transition is particularly desirable. During that transitional period, appropriate interpolated combination weightings can be used.

The period over which the smoothed variation occurs can be the same for gain changes of either polarity (i.e. for a rising and a falling input signal), but it is useful to employ a different rate of change in the two directions. For a rising input signal, it is preferred that the whole system responds quickly in order to avoid overload, so the length of the raised-cosine transitional period might be, for example, a few tens of μS (e.g. 30 μS). For a falling input analogue signal, the response period can be much slower, for example 20 mS. Note that these response periods preferably apply once the switching period described above, during which time the output of a conversion path is not used, is over. Note also that in the case of a falling signal, the transition takes effect after the delay period τ described below.

Figure 10:
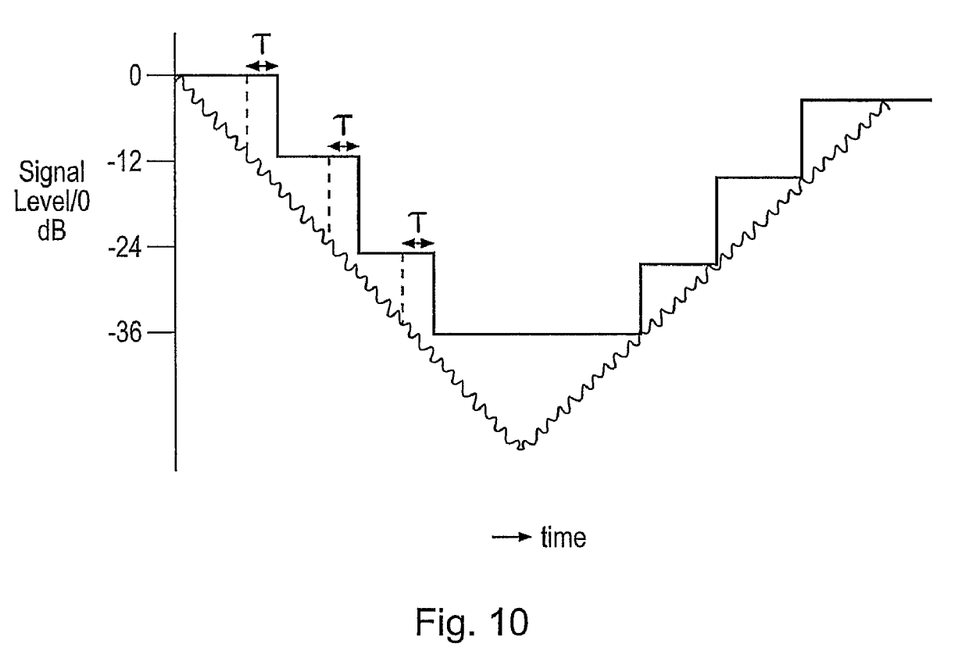
FIG. 10 schematically illustrates gain switching thresholds and timings.

FIG. 10 schematically illustrates the timing of the transitions from one column to another in the above table. The jagged line schematically represents signal level, and the staircase represents the transitions from column to column in the above tables.

When the signal level is falling, a delay τ is applied after the signal level drops below a relevant threshold (e.g. −12 dB) before the system changes to the next higher sensitivity. This is to avoid switching too often in a rapidly varying signal. The delay period τ might be, for example, 100 mS.

However, on a rising signal it is important to change sensitivity very rapidly after the signal level crosses the relevant threshold, in order to avoid the overload problems described above. So, no delay (i.e. no extra delay, in addition to the intrinsic delay of the circuitry itself) is applied on a rising signal.

The thresholds for rising and falling signals are shown as identical, but could be offset if required.

FIGS. 11A to 11F schematically illustrate signal handling techniques relevant where the output signal from the ADC arrangement has to be transmitted via a data channel capable of handling a certain number of bits per sample. The skilled man will appreciate that two or more of these techniques could be combined.

To explain the need for this type of technique, consider the situation where each of the ADC devices 110A ... D operates at a 24 bit resolution, that is to say, they generate samples of 24 bits per sample. The amplification and subsequent equalisation processes involve multiplying these 24 bit words by other coefficients, which will mean that when the samples are added together in the mixer the output word will be of a higher resolution than 24 bits—for example it might be a 32 bit word. But audio data channels such as the standard AES data channel can handle only 24 bit words.

In FIGS. 11A to 11F, the vertical broken line is used to indicate schematically a boundary between processing which takes place as part of the ADC arrangement's functionality (to the left of the broken line) and processing which could optionally take place downstream—for example, after the output signal of the ADC arrangement has been stored or transmitted.

It will be appreciated that the values of 24 and 32 bits are merely examples.

Figure 11A:
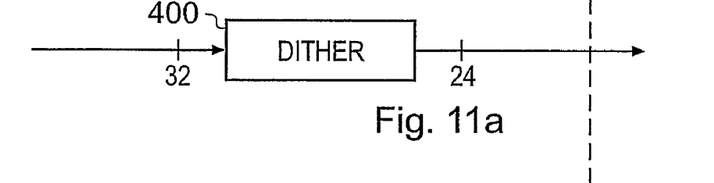
FIGS. 11*a* to 11*f* schematically illustrate signal handling techniques.

FIG. 11A schematically illustrates a simple dither and truncating arrangement 400 to convert the higher resolution words output by the mixer 60 into the 24 bit words for subsequent processing. Adding a dither signal component, which is small (e.g. of the order of 1 LSB) with respect to the signal resolution at the output of the truncation operation, is a known technique in itself. The sum of the mixer output and the dither component is truncated to the required output resolution.

Figure 11B:
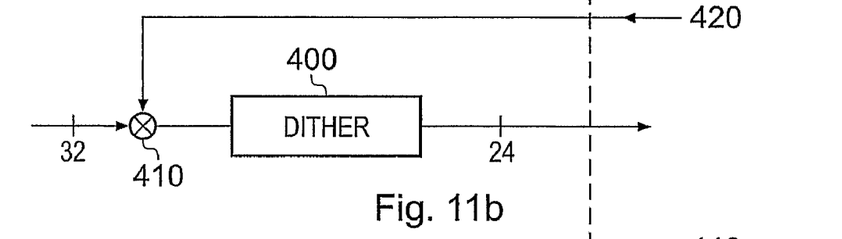

In FIG. 11B, a similar arrangement is used in which a level control (a multiplier) 410 operates under the control of a level adjustment signal 420 supplied from downstream processing equipment or a user.

Figure 11C:
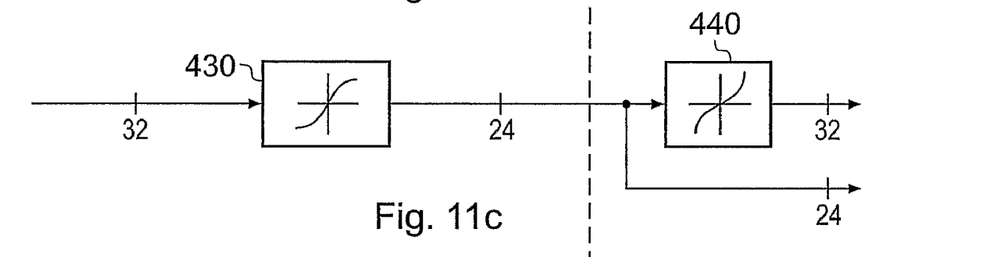

In FIG. 11C, the higher resolution words output by the mixer 60 are matched to 24 bit words by a non-linear mapping relationship (e.g. a lookup table 430). Downstream, an inverse mapping relationship 440 can be applied to regenerate 32 bit words or the 24 bit words can be used for subsequent processing.

Figure 11D:
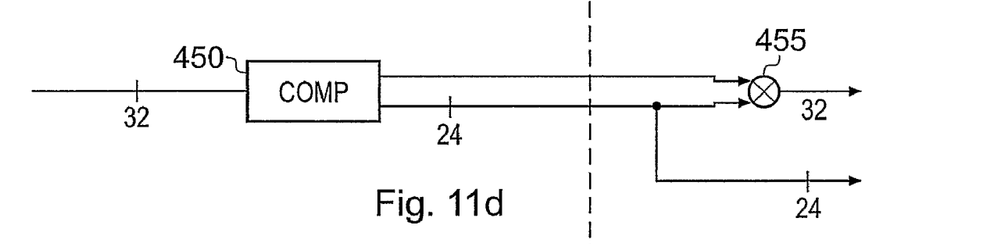

FIG. 11D schematically illustrates a compressor 450 (known in itself) which compresses the higher resolution words down to 24 bits. The compression factor can be derived from the signal itself, using known techniques, and can also be transmitted with or in association with the 24 bit signal so that the 32 bit words can be (at least nearly) reconstructed by a multiplier 455 downstream.

Figure 11E:
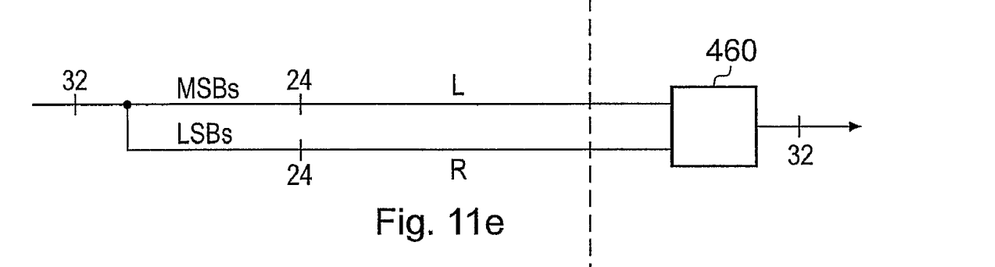

In FIG. 11E, different portions of the words are transmitted by respective 24 bit channels (e.g. left and right channels of an AES system). In the example shown, the most significant 24 bits are transmitted via a left audio channel and the least significant 24 bits are transmitted by a right audio channel. These two ranges may overlap if the input signal is—as shown here—less than 48 bit resolution. Or alternatively one or both of the left and right channels can transmit dummy bits to occupy some of its 24 bit capacity. The two portions can be recombined downstream by a combiner 460.

Figure 11F:
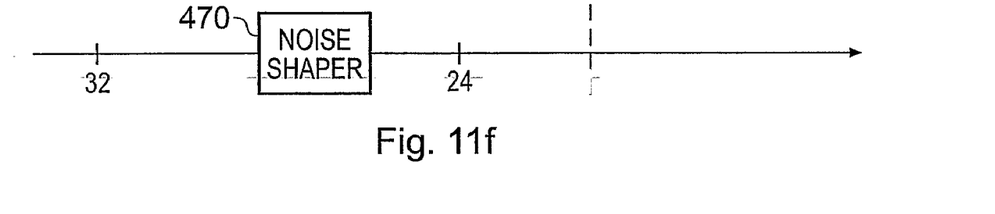

Finally, in FIG. 11F, a noise shaping arrangement 470 is illustrated. Noise shaping techniques are well known and can be used to reduce the noise over a certain frequency and increase the noise in another frequency band. So, the arrangement of FIG. 11F is particularly useful in systems where the sampling rate allows noise shaping to move system noise to a sub-region of the available frequency range which is beyond the normal limits of human hearing.

Figure 12:
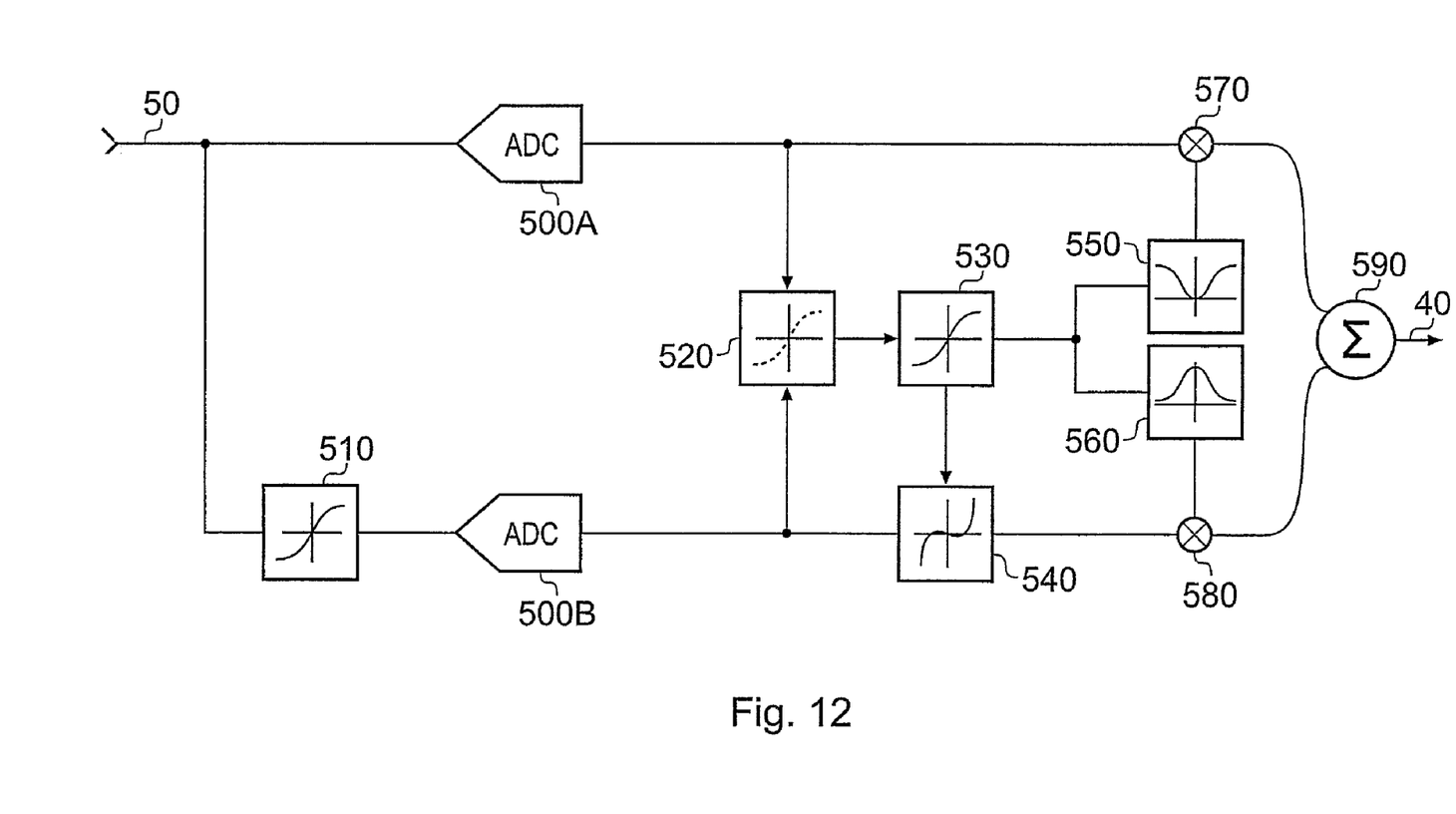
FIG. 12 schematically illustrates a second embodiment of an ADC arrangement.

FIG. 12 schematically illustrates a second embodiment of an ADC arrangement. Again, an input signal (analogue audio signal) 50 is converted to a digital output signal 40.

The input signal is supplied to two ADC devices 500 A, 500 B in parallel. However, before the signal is passed to the ADC 500 B, a non-linear amplification curve is applied at an amplifier 510.

The output signals of the two ADCs 500 are processed to reconstruct the response curve of the amplifier 510. This response curve is stored in a memory 520. The reconstruction process is straightforward and simply involves comparing the values of equivalent samples generated by the two ADCs and storing the results as a response curve.

A known curve-fitting technique, such as Chebyshev curve fitting is used to generate a smoothed re-constructed response curve 530. This in turn is used to generate an inverse response 540 which is applied as a digital mapping to the output words from the ADC 500 B. The response curve 530 is also squared to give a curve 550 of mixing coefficient against signal value.

The inverse of that curve 560 is also generated. The two curves 550, 560 are normalised so that the sum of the two coefficients defined by the two curves at any signal value is unity.

The current signal value from the ADC 500 A is used to index two coefficients from the curves 550 and 560, which are then applied to two respective multipliers 570, 580 which act on the output from the ADC device 500 A and the reconstructed output from the ADC 500 B. Finally, a summer 590 sums the two multiplier outputs to generate the output digital signal 40.

Figure 13:
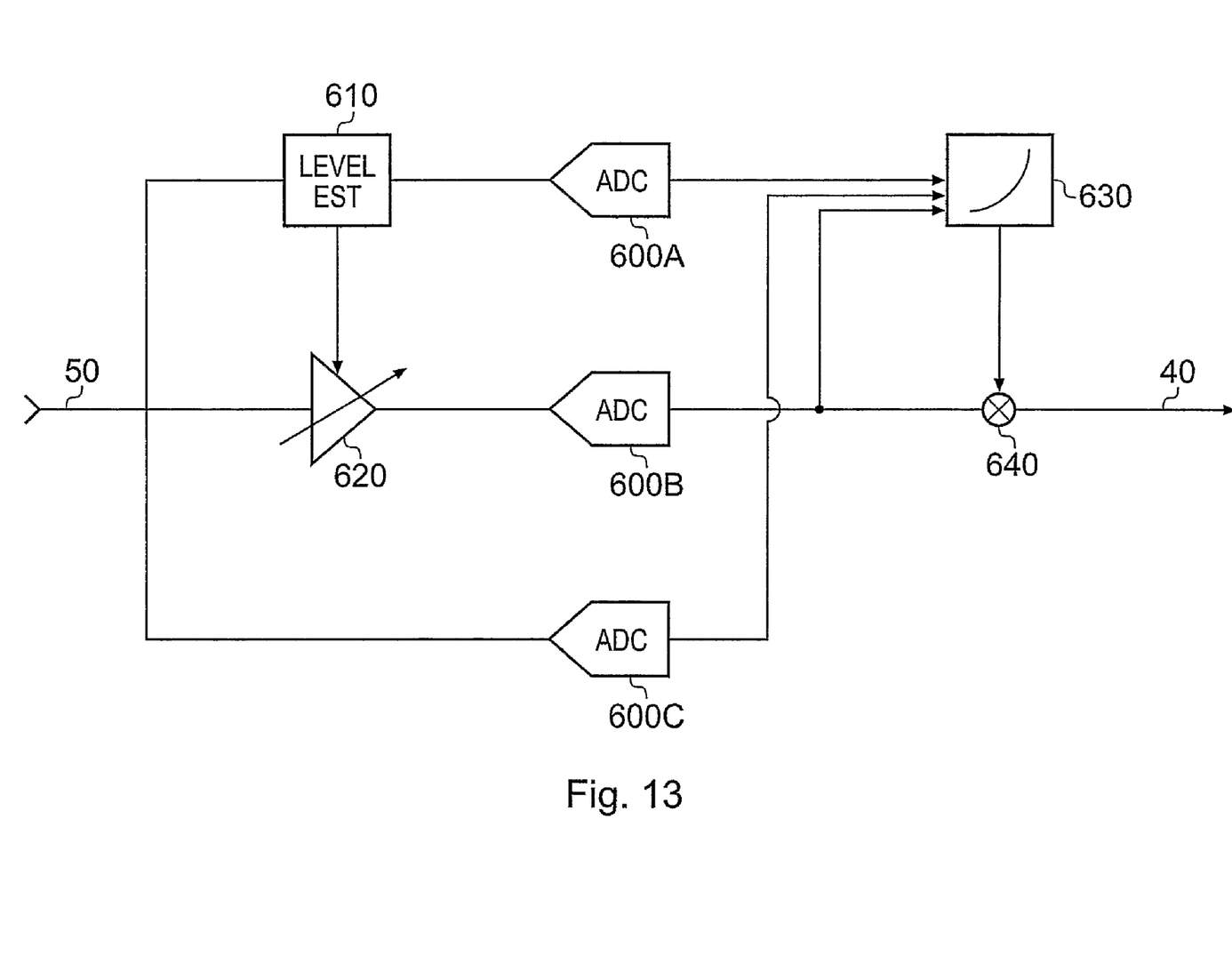
FIG. 13 schematically illustrates a third embodiment of an ADC arrangement.

Finally, FIG. 13 schematically illustrates a third embodiment of an ADC arrangement. Again, an input signal 50 (an analogue audio signal) is converted to a digital output signal 40.

The input signal is passed through three conversion paths including ADC devices 600 A, 600 B and 600 C.

The first conversion path includes a level estimator 610. The output of the level estimator (i.e. a control signal indicating the level of the input audio signal 50) is converted by the ADC 600 A into digital form. The output of the level estimator also controls a voltage controlled amplifier (VCA) 620, the output of which feeds the ADC device 600 B. Finally, the ADC device 600 C receives a direct version of the input signal.

In a learning phase (which may continue throughout the operation of the arrangement), the intermediate representation outputs of the ADCs 600 A . . . C are combined to reconstruct the response curve of the combination of the level estimator 610 and the VCA 620. This is achieved at least in part by comparing the output of the ADC 600B with the output of the converter 600C and is expressed as a gain value for each possible signal value of the original input signal 50.

In operation, the output of the ADC 600 C is then used to look up a gain value which would have been applied by the level estimator/VCA combination to the signal supplied to the ADC 600 B. An inverse gain value is calculated and a multiplier 640 multiplies the output of the ADC 640 B by that inverse gain value.

Accordingly, the combination of intermediate representations to generate an output digital representation may be considered to include either or both of the following:

(a) combining the intermediate representations so that the output representation depends on a linear or other sum of two or more intermediate representations; and/or (b) using one or more intermediate representations to control one or more other intermediate representations—for example in the way that the output of the ADC 600C in FIG. 13 contributes to the control of the multiplier 640.

An ADC arrangement as shown above may be embodied in audio processing apparatus such as a recording apparatus or a mixing apparatus.

The invention claimed is:

1. An analog-to-digital conversion arrangement for converting an input analog signal into an output digital representation, the arrangement comprising:

two or more analog-to-digital conversion paths each applying a conversion mapping between input analog signal magnitudes and respective digital values to generate an intermediate representation of the input analog signal, the conversion paths being operable to apply different respective conversion mappings; and an output circuit operable to combine the intermediate representations from at least two conversion paths to generate the output digital representation, the intermediate representations being combined according to a weighting dependent on the magnitude of the input analog signal, wherein a first of the two or more conversion paths is a low sensitivity conversion path while at least a second of the two or more conversion paths has a gain making it higher in sensitivity than the first than the first of the at least two conversion paths.

2. An arrangement according to claim 1, in which at least one of the conversion paths has an enhanced sensitivity mode appropriate to a range of magnitudes of the input signal which are below a threshold magnitude;

the arrangement comprising control logic for inhibiting operation in the enhanced sensitivity mode if the magnitude of the input analog signal exceeds the threshold magnitude.

3. An analog-to-digital conversion arrangement for converting an input analog signal into an output digital representation, the arrangement comprising:

two or more analog-to-digital conversion paths each operable to generate a respective intermediate representation of the input analog signal, in which at least a first conversion path has an enhanced sensitivity mode appropriate to a range of magnitudes of the input signal which are below a threshold magnitude;

control logic for inhibiting operation in the enhanced sensitivity mode by reducing a gain in the first conversion path if the magnitude of the input analog signal exceeds the threshold magnitude; and an output circuit arranged to derive the output digital representation from two or more of the intermediate representations including that of the first conversion path.

4. An arrangement according to claim 1, operable to modify one or more intermediate representations to compensate for differences in conversion mappings used in the generation of those intermediate representations.

5. An arrangement according to claim 4, comprising:

means for comparing two or more intermediate representations; and means for adjusting the magnitude of at least one of the intermediate representations in accordance with the comparison.

6. An arrangement according to claim 1, in which the weighting applied by the output circuit is dependent on the conversion mappings of the conversion paths.

7. An arrangement according to claim 1, comprising means for reducing the resolution of the output digital representation.

8. An arrangement according to claim 7, in which the reducing means comprises:

dither logic operable to add a dither component to the output digital representation to form a dithered representation; and truncating logic operable to truncate the dithered representation.

9. An arrangement according to claim 8, in which the reducing means comprises:

a magnitude adjuster, operable to adjust the magnitude of the output digital representation before addition of the dither component.

10. An arrangement according to claim 7, in which the reducing means comprises:

mapping logic for mapping values of the output digital representation to respective values of a reduced-resolution representation.

11. An arrangement according to claim 10, comprising:

inverse-mapping logic, downstream of the mapping logic, for mapping values of the reduced-resolution representation to respective values of an enhanced-resolution representation.

12. An arrangement according to claim 7, in which the reducing means comprises:
 means for generating two or more reduced-resolution representations, each representing a respective subset of the output digital representation.

13. An arrangement according to claim 12, comprising means for transmitting or storing the two or more reduced-resolution representations as respective channels of a multi-channel audio handling arrangement.

14. An arrangement according to claim 7, comprising a noise shaper arranged to generate a reduced-resolution representation having a reduced noise component in a subset of the available frequency range.

15. An arrangement according to claim 1, in which the output circuit comprises means for deriving a magnitude control value from at least one of the intermediate representations, the magnitude control value being applied to alter the magnitude of at least another intermediate representation.

16. An arrangement according to claim 1, in which at least one of the conversion paths comprises: an adjuster operable to adjust the magnitude of the input analog signal to generate a magnitude-adjusted analog signal; and a converter operable to form the respective intermediate representation as a digital version of the magnitude-adjusted input analog signal.

17. An arrangement according to claim 16 in which the adjuster is selectively operable to adjust the magnitude of the input analog signal in accordance with two or more possible degrees of adjustment.

18. An arrangement according to claim 17, in which the adjuster of a conversion path having an enhanced sensitivity mode uses a different degree of adjustment when operating in the enhanced sensitivity mode than when not operating in the enhanced sensitivity mode.

19. An arrangement according to claim 18, in which the degree of adjustment used by a conversion path having an enhanced sensitivity mode when not operating in the enhanced sensitivity mode is the same as a degree of adjustment of one of the other conversion paths.

20. An arrangement according to claim 17, in which:
 the adjuster comprises an input buffer and an amplifier.

21. An arrangement according to claim 20, in which:
 the gain of the amplifier is determined, at least in part, by an input resistance; and
 the input resistance comprises two series-connected resistors.

22. An arrangement according to claim 21, comprising a switch operable to ground the junction of the two series-connected resistors in order to alter the gain of the amplifier.

23. An arrangement according to claim 22, in which the switch is operable to ground the junction via another resistor.

24. An arrangement according to claim 21, comprising:
 a pair of the adjusters arranged to handle a balanced signal; and
 a switch operable to connect together the junctions of the respective series-connected resistors in the two adjusters, in order to alter the gain of the adjusters.

25. An arrangement according to claim 24, in which the switch is operable to connect the junctions together via at least one further resistor.

26. An arrangement according to claim 24, in which the switch is operable to connect the junctions together via a substantially symmetric resistor arrangement, the switch being disposed at or near a ground potential with respect to the symmetric resistor arrangement.

27. An arrangement according to claim 20, in which at least one adjuster comprises two or more parallel-connected input buffers.

28. An arrangement according to claim 20, in which the or each input buffer has a non-unity gain.

29. An arrangement according to claim 1, in which:
 at least one of the conversion paths is switchable between two or more conversion mappings;
 the output circuit is operable not to include the intermediate representation from a conversion path, for a predetermined period after the path has switched conversion mapping, in the generation of the output digital representation.

30. An arrangement according to claim 29, comprising control logic operable:
 to control switching of a conversion mapping in response to the magnitude of the input analog signal rising above a switching threshold magnitude or falling below the same or another switching threshold magnitude;
 to inhibit switching of the conversion mapping for at least a predetermined time period after the magnitude of the input analog signal has fallen below the switching threshold magnitude.

31. An arrangement according to claim 30, in which the control logic comprises an analog-to-digital-converter, having an operating-speed faster than a conversion path.

32. An arrangement according to claim 1, in which the input analog signal is an audio signal.

33. Audio processing apparatus comprising an arrangement according to claim 32.

34. An analog-to-digital conversion method for converting an input analog signal into an output digital representation, the method comprising:
 two or more analog-to-digital conversion steps for applying a conversion mapping between input analog signal magnitudes and respective digital values to generate an intermediate representation of the input analog signal, the conversion steps applying different respective conversion mappings; and
 an output step for combining the intermediate representations from at least two conversion steps to generate the output digital representation, the intermediate representations being combined according to a weighting dependent on the magnitude of the input analog signal, wherein a first of the two or more conversion paths is a low sensitivity conversion path while at least a second of the two or more conversion paths has a gain making it higher in sensitivity than the first than the first of the at least two conversion paths.

35. An analog-to-digital conversion method for converting an input analog signal into an output digital representation, the method comprising:
 two or more analog-to-digital conversion steps each generating a respective intermediate representation of the input analog signal, at least a first conversion step of the two or more conversion steps is a low sensitivity conversion step and a second conversion step of the two or more conversion steps has an enhanced sensitivity mode appropriate to a range of magnitudes of the input signal which are below a threshold magnitude;
 an inhibiting step for inhibiting operation in the enhanced sensitivity mode by reducing a gain in the first conversion step if the magnitude of the input analog signal exceeds the threshold magnitude; and
 an output step for deriving the output digital representation from two or more of the intermediate representations including that of the first conversion step.

* * * * *